US011502089B2

(12) United States Patent
He et al.

(10) Patent No.: US 11,502,089 B2
(45) Date of Patent: Nov. 15, 2022

(54) THREE-DIMENSIONAL FUSE ARCHITECTURES AND RELATED SYSTEMS, METHODS, AND APPARATUSES

(71) Applicant: Micron Technology, Inc., Boise, ID (US)

(72) Inventors: Yuan He, Boise, ID (US); Daigo Toyama, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/063,194

(22) Filed: Oct. 5, 2020

(65) Prior Publication Data
US 2022/0108995 A1 Apr. 7, 2022

(51) Int. Cl.
*G11C 17/16* (2006.01)
*H01L 27/112* (2006.01)
*G11C 11/419* (2006.01)

(52) U.S. Cl.
CPC ...... *H01L 27/11206* (2013.01); *G11C 11/419* (2013.01); *G11C 17/16* (2013.01)

(58) Field of Classification Search
CPC .............................. G11C 11/419; G11C 17/16
USPC ......................................................... 365/96
See application file for complete search history.

(56) References Cited

U.S. PATENT DOCUMENTS

| | | | | |
|---|---|---|---|---|
| 6,682,959 B2 * | 1/2004 | Bang | ................... | H01L 23/5258 438/132 |
| 7,859,925 B1 * | 12/2010 | Stansell | ............... | G11C 29/027 365/201 |
| 8,848,423 B2 * | 9/2014 | Chung | .................. | H01L 27/224 365/148 |
| 10,937,515 B1 * | 3/2021 | He | ......... | G11C 17/16 |
| 2003/0213998 A1 * | 11/2003 | Hsu | ...................... | H01L 23/5252 257/358 |
| 2005/0180228 A1 * | 8/2005 | Canada | ................ | G11C 7/1045 365/194 |
| 2006/0189042 A1 * | 8/2006 | Sakoh | ............... | H01L 27/11803 438/132 |
| 2007/0096251 A1 * | 5/2007 | Han | ..................... | H01L 23/5258 257/529 |
| 2013/0322160 A1 * | 12/2013 | Kim | ....................... | G11C 29/04 365/154 |
| 2021/0142847 A1 * | 5/2021 | Kim | .................... | G11C 11/4097 |

* cited by examiner

*Primary Examiner* — Muna A Techane
(74) *Attorney, Agent, or Firm* — TraskBritt

(57) ABSTRACT

Apparatuses, methods, and computing systems relating to three-dimensional fuse architectures are disclosed. An apparatus includes a semiconductor substrate, a fuse array on or in the semiconductor substrate, and fuse circuitry on or in the semiconductor substrate. The fuse array includes fuse cells. The fuse circuitry is configured to access the fuse cells. The fuse circuitry is offset from the fuse array such that the fuse circuitry is disposed between the semiconductor substrate and the fuse array, or the fuse array is disposed between the semiconductor substrate and the fuse circuitry.

18 Claims, 9 Drawing Sheets

THREE-DIMENSIONAL FUSE ARCHITECTURES AND RELATED SYSTEMS, METHODS, AND APPARATUSES

TECHNICAL FIELD

This disclosure relates generally to three-dimensional fuse architectures, and more specifically to three-dimensional fuse array architectures for semiconductor memory devices.

BACKGROUND

Arrays of fuses may be used for long-term data storage in volatile data storage devices such as memory devices. Such memory devices include fuse circuitry configured to access (e.g., write data to, read data from) fuses in the fuse array. With data stored to fuses of the fuse array, upon a power-up or reset of the memory device the data is read and latched, and may be delivered to and used by various components of the memory device.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 2:
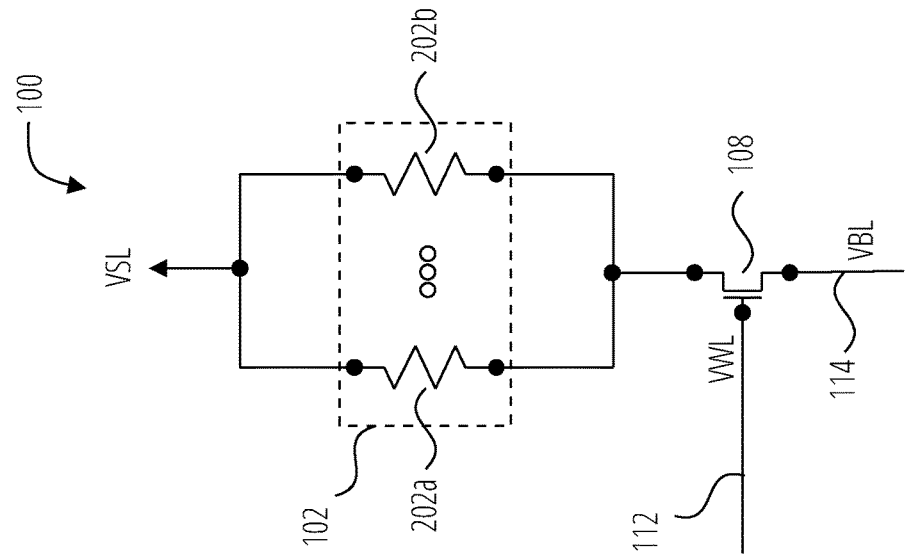
FIG. 2 is another schematic illustration of the portion of the fuse device of FIG. 1, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, one or more microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., substantially twenty degrees centigrade). Examples of semiconductor materials include element semiconductor materials found in column IV of the period table of elements such silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials. Accordingly, the term "semiconductor material," as used herein, refers specifically to crystalline semiconductor materials unless explicitly indicated otherwise herein.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor material may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "fuse" refers to a device that has a first electrical resistance in a default state and a second electrical resistance that is different from the first electrical resistance in a blown state. In some embodiments the first electrical resistance (default state) may be lower than the second electrical resistance (blown state). In some embodiments the first electrical resistance (default state) may be higher than the second electrical resistance (blown state), such as with an anti-fuse (an anti-fuse is sometimes referred to herein merely as a "fuse"). One non-limiting example of a fuse is a MOSFET capacitor (MOSCap), which has a relatively high electrical resistance in its default state (e.g., on the order of kiloohms (KΩ) to tens of kΩ) and a lower electrical resistance in its blown state (e.g., on the order of gigaohms (GΩ)). The different states of a fuse may be electrically set (e.g., by providing appropriate electrical signals to the fuse such as a fuse blowing voltage potential). Electrically setting the state of a fuse in this manner (e.g., blowing the fuse or leaving the fuse unblown) may be referred to herein as a "write operation," which is one way to access the fuse. Also, the different states (default state, blown state) of a fuse are electrically measurable because of the difference in electrical resistance between the different states, which may be measured by applying electrical signals (e.g., voltage potential biases, electrical current biases) and measuring a response of the fuse to the electrical signals. Measuring the state (e.g., blown or unblown) of a fuse in this way may be referred to herein as a "read operation," which is another way to access the fuse. A latch circuit may be used to measure and actively store a response signal responsive to read potentials applied to a fuse. Accordingly, a fuse may be used to permanently store a bit of information by associating different logical levels (e.g., a "1" and a "0") to the different states (e.g., default and blown) of the fuse. An array or bank of fuses may be used to permanently store multiple bits of information.

Memory devices such as dynamic random access memory (DRAM) devices may use fuse banks to store bits that are pertinent to their operation. As one example, fuse banks may be used to store information indicating offsets of input buffers of a memory device, without limitation. As another example, fuse banks may be used to store addresses of memory cells that need to be repaired.

As used herein, the term "semiconductor substrate" refers to a material or surface including a semiconductor material upon or within which semiconductor devices, such as MOSFETs and fuses, may be formed. For example, a semiconductor substrate may include an entirety or a portion of a wafer of semiconductor material (e.g., intrinsic semiconductor material). As another example, a semiconductor substrate may include a semiconductor on insulator substrate such as a silicon on insulator (SOI) substrate (e.g., a silicon on glass substrate, a silicon on sapphire substrate).

Disclosed herein are semiconductor devices (e.g., memory devices) having three-dimensional fuse architecture. For example, some embodiments disclosed herein include a semiconductor device including a semiconductor substrate, a fuse array, and fuse circuitry configured to access fuses of the fuse array with the fuse circuitry disposed between the fuse array and the semiconductor substrate. As another example, some embodiments disclosed herein include a semiconductor device including a semiconductor substrate, a fuse array, and fuse circuitry configured to access fuses of the fuse array with the fuse array disposed between the semiconductor substrate and the fuse circuitry. As used herein, the terms "access" and "control," when used with reference to a fuse or a fuse array, refer to read and/or write operations performed on the fuse or the fuse array. The fuse circuitry may include circuitry to write bits to the fuses, read bits from the fuses, latch the read bits, compare addresses, or combinations thereof.

Three-dimensional fuse architectures disclosed herein may prevent or reduce complications associated with including both a fuse array and fuse circuitry configured to access the fuse array within a common two-dimensional structure on or in a semiconductor substrate. For example, the three-dimensional fuse architectures disclosed herein may render complex fuse broadcast and load schemes used with two-dimensional fuse architectures unnecessary. As a result, not only do the three-dimensional fuse architectures disclosed herein cover reduced area, or "real estate," of the semiconductor substrate as compared to two-dimensional fuse architecture due to overlapping fuse arrays and fuse circuitry, the three-dimensional fuse architectures disclosed herein cover even further reduced area of the semiconductor substrate because of less complex fuse circuitry than that used in two-dimensional fuse architectures.

Also, the three-dimensional fuse architectures disclosed herein may enable the use of relatively simple latches in the fuse circuitry to latch data bits read from the fuses. As a specific, non-limiting example, relatively simple latches such as static random access memory (SRAM) latches or D-type flipflop latches may be used in contrast to more complicated dual interlocked storage cell (DICE) latches, which may be used in two-dimensional architectures that are more prone to soft errors than the three-dimensional fuse architectures disclosed herein. Simpler latches such as SRAM latches may occupy less area on a semiconductor substrate than DICE latches, which enable the three-dimensional fuse architectures disclosed herein to conserve valuable area. Although SRAM latches may be more vulnerable to soft errors than DICE latches, the three-dimensional fuse architectures disclosed herein are less prone to soft errors than two-dimensional fuse architectures, and may therefore be implemented using SRAM latches without unreasonable risk of soft errors.

In some embodiments an apparatus includes a semiconductor substrate, a fuse array on or in the semiconductor substrate, and fuse circuitry on or in the semiconductor substrate. The fuse array includes two or more fuse cells. The fuse circuitry is configured to access the fuse cells. The fuse circuitry is offset from the fuse array such that the fuse circuitry is disposed between the semiconductor substrate and the fuse array, or the fuse array is disposed between the semiconductor substrate and the fuse circuitry.

In some embodiments a method of reading a bit of information from a fuse cell of a fuse array includes pre-charging, with fuse circuitry disposed between a semiconductor substrate and the fuse array, a bit line corresponding to the fuse cell to a pre-charge voltage potential. The method also includes providing, with the fuse circuitry, a complementary voltage potential to the fuse cell, the complementary voltage potential complementary to the pre-charge voltage potential. The method further includes electrically connecting, with the fuse circuitry, the fuse cell to the pre-charged bit line. The method also includes comparing, with the fuse circuitry, a bit line voltage potential to a reference voltage potential a predetermined period of time following the electrical connection of the fuse cell to the pre-charged bit line. The method further includes providing, to a latch circuit of the fuse circuitry, a fuse data signal indicating the bit of information from the fuse cell responsive to the comparison of the bit line voltage potential to the reference voltage potential.

In some embodiments a method of blowing a fuse cell of a fuse array includes providing, with fuse circuitry disposed between a semiconductor substrate and the fuse array, a program voltage potential to the fuse cell. The method also includes asserting, with the fuse circuitry, a word line signal at a gate terminal of a word line access transistor to electrically connect a bit line corresponding to the fuse cell to the fuse cell. The method further includes asserting, with the fuse circuitry, a select voltage potential at a gate terminal of a fuse cell select transistor to electrically connect the bit line to a power supply low voltage potential node.

In some embodiments a computing system includes a fuse device including a semiconductor substrate, a fuse array on or in the semiconductor substrate, and fuse circuitry. The fuse array includes a fuse cell. The fuse circuitry is configured to access the fuse cell. The fuse circuitry is disposed between the semiconductor substrate and the fuse array.

Figure 1:
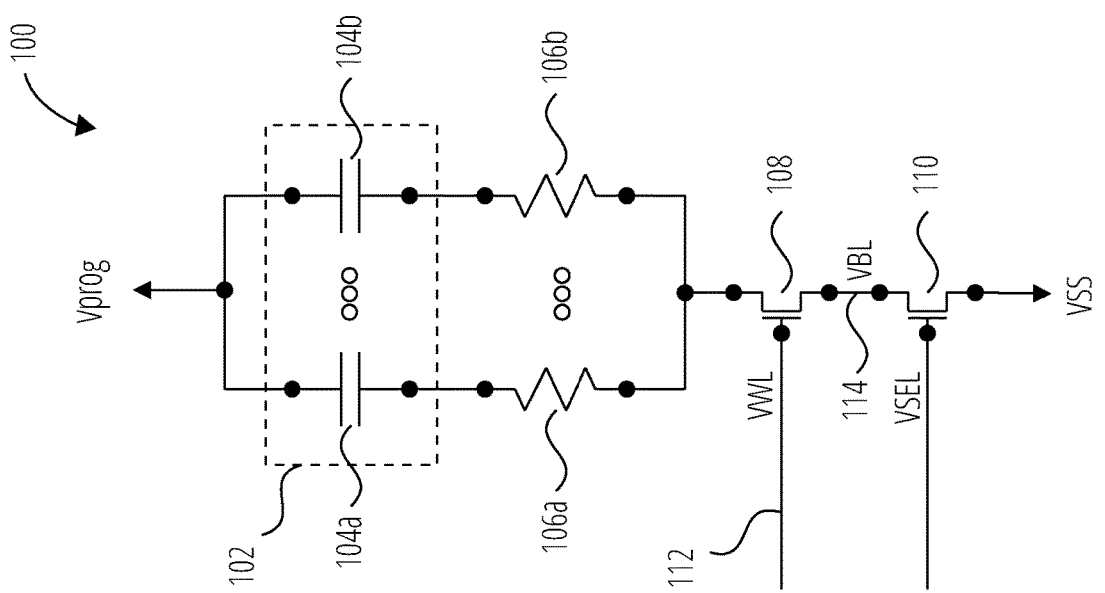
FIG. 1 is an equivalent circuit schematic illustration of a portion of a fuse device, according to some embodiments.

FIG. 1 is an equivalent circuit schematic illustration of a portion of a fuse device 100, according to some embodiments. The fuse device 100 includes a fuse cell 102 including one or more fuses 104a, ..., 104b electrically connected in parallel with each other. Although several examples of fuse cells including two fuses are discussed in detail herein, it is contemplated within the scope of the disclosure that all such embodiments may be implemented using fuse cells including any number of fuses (e.g., one single fuse, two fuses, three fuses, four fuses, five fuses, ten fuses, fifteen fuses, or any number of fuses per fuse cell). FIG. 1 also illustrates contact resistances 106a, ..., 106b electrically connected in series with the fuses 104a, ..., 104b. The fuse device 100 further includes a word line 112 and a bit line 114 corresponding to the fuse cell 102. The fuse device 100 also includes a word line access transistor 108 (e.g., a MOSFET) electrically connected between the fuse cell 102 and the bit line 114 and a fuse cell select transistor 110 (e.g., a MOSFET) electrically connected between the bit line 114 and a power supply low voltage potential node VSS. The word line 112 is electrically connected to a gate terminal of the word line access transistor 108 to control electrical connection of the fuse cell 102, through the word line access transistor 108, to the bit line 114. Also, a select voltage potential VSEL provided to a gate terminal of the fuse cell select transistor 110 is configured to control electrical connection of the bit line 114 to the power supply low voltage potential node VSS.

The fuses 104a, ..., 104b may include anti-fuses such as, for example, MOSFET capacitors (MOScaps). An electrical resistance of each one of the fuses 104a, ..., 104b individually in an unblown state may be on the order of substantially one GΩ. The electrical resistance of each one of the fuses 104a, ..., 104b in a blown state may be on the order of substantially one kΩ to tens of kΩ. Assuming, for example, a 10 kΩ electrical resistance in the blown state and a 1 GΩ resistance in the unblown state, the electrical resistance in the unblown state is 100,000 times higher than the resistance in the blown state.

The contact resistances 106a, ..., 106b represent the electrical resistances due to electrical contacts electrically connecting the one or more fuses 104a, ..., 104b to the word line access transistor 108. In the embodiment of FIG. 1 each of the fuses 104a, ..., 104b in the fuse cell 102 is electrically connected to the same word line access transistor 108. As a result, an assertion of a word line signal VWL at the gate terminal of the word line access transistor 108 will electrically connect each of the one or more fuses 104a, ..., 104b of the fuse cell 102 to the bit line 114 through the contact resistances 106a, ..., 106b and the word line access transistor 108. In embodiments where each of the one or more fuses 104a, ..., 104b has its own word line access transistor 108 (not shown), each of the one or more fuses 104a, ..., 104b may be electrically connected to the bit line 114 individually responsive to word line signals (e.g., VWLa, VWLb, not shown). If a select signal VSEL at a gate terminal of the fuse cell select transistor 110 is asserted (in embodiments where one word line access transistor 108 is used to access each of the one or more fuses 104a, ..., 104b) while the word line signal VWL is asserted, each of the one or more fuses 104a, ..., 104b of the fuse cell 102 will be electrically connected to the power supply low voltage potential node VSS. Also, a bit line voltage potential VBL may be driven to the power supply low voltage potential VSS because the bit line 114 is electrically connected to the power supply low voltage potential node VSS through the fuse cell select transistor 110.

In a write operation, if it is desired to blow the fuses 104a, ..., 104b, a program voltage potential Vprog may be applied to the fuse cell 102 (i.e., to each of the one or more fuses 104a, ..., 104b). By way of non-limiting example, the program voltage potential Vprog may be substantially five volts (5 V) higher than a power supply low voltage potential VSS applied to the power supply low voltage potential node VSS. The identifier "VSS" may be used herein interchangeably to refer both to the power supply low voltage potential node VSS and to the power supply low voltage potential VSS, and the distinctions between the two will be apparent to those of ordinary skill in the art based on the context of its use. The gate terminals of both the word line access transistor 108 and the fuse cell select transistor 110 may be asserted to electrically connect the fuses 104a, ..., 104b to the power supply low voltage potential node VSS through the fuse cell select transistor 110 and the word line access transistor 108. By way of non-limiting example, the word line signal VWL may be set to substantially 2.5 V above VSS and the select voltage potential VSEL may be set to substantially a power supply high voltage potential VDD. As a result, a voltage potential across the fuse cell 102 may be substantially the difference between the program voltage potential and the power supply low voltage potential VSS (e.g., substantially 5 V), which should be sufficient to blow each of the one or more fuses 104a, ..., 104b of the fuse cell 102.

Responsive to the write operation, the electrical resistance of each of the fuses 104a, ..., 104b will reduce from an unblown electrical resistance (e.g., substantially 1 GΩ) to a blown electrical resistance (e.g., substantially 10 kΩ). As a result, the electrical resistance of the fuse cell 102 will reduce from a parallel combination of the unblown electrical resistances (e.g., 500 MΩ where the number of the fuses 104a, ..., 104b is two) to a parallel combination of the blown electrical resistances (e.g., 5 kΩ where the number of the fuses 104a, ..., 104b is two). Even in the case where one of the fuses 104a, ..., 104b fails to blow, the electrical resistance of the fuse cell 102 will still reduce a substantial amount so long as at least one of the fuses 104a, ..., 104b successfully blows. Even if a failure in blowing one or more of the fuses 104a, ..., 104b occurs, as long as at least one of the fuses 104a, ..., 104b is blown the total electrical resistance across the fuse cell 102 will be low enough to correspond to a blown state of the fuse cell 102 because of the large difference in electrical resistances between the blown state and the unblown state of the fuses 104a, ..., 104b. Accordingly, the reliability of a write operation to blow the fuse cell 102 may be significantly better for a fuse cell 102 having multiple fuses 104a, ..., 104b than for a fuse cell having only a single fuse because the fuse cell 102 registers as blown even if all but one of the fuses 104a, . . . , 104b fail to blow.

As previously mentioned, a word line access transistor similar to the word line access transistor 108 may be provided for each one of the fuses 104a, . . . , 104b to individually control access to each one of the fuses 104a, . . . , 104b (not shown) (e.g., one word line access transistor for every one of the one or more fuses 104a, . . . , 104b). In such embodiments the chances of successfully blowing each of the fuses 104a, . . . , 104b during a write operation may increase relative to embodiments where a single word line access transistor 108 is used for all of the one or more fuses 104a, . . . , 104b. This is because if one of the one or more fuses 104a, 104b has a higher electrical resistance than others of the one or more fuses 104a, . . . , 104b, the fuse that has higher electrical resistance may not blow during a write operation because fuses with lower electrical resistance may draw away blowing currents from the fuses with higher electrical resistance. Once one or more of the fuses 104a, . . . , 104b is blown without a higher electrical resistance fuse blowing, it may be difficult to blow the remaining higher resistance ones of the one or more fuses 104a, . . . , 104b because it may be difficult to apply the same voltage potential bias across the higher resistance fuses with blown fuses electrically connected in parallel therewith. Accordingly, the use of a separate word line access transistor for each one of the one or more fuses 104a, . . . , 104b may increase the chances of successfully blowing a larger number of the one or more fuses 104a, . . . , 104b during a write operation.

FIG. 2 is another schematic illustration of the portion of the fuse device 100 of FIG. 1, according to some embodiments. The fuse device 100 shown in FIG. 2 illustrates the fuse cell 102, the word line access transistor 108, the word line 112, and the word line access transistor 108 of FIG. 1. FIG. 2, however, illustrates one or more fuses 202a, . . . , 202b of the fuse cell 102, each of which includes a series combination of one of the fuses 104a, . . . , 104b with its corresponding one of the contact resistances 106a, . . . , 106b. Accordingly, an electrical resistance of each of the fuses 202a, . . . , 202b is a sum of the corresponding one of the fuses 104a, . . . , 104b with its corresponding one of the contact resistances 106a, . . . , 106b.

It is noted that FIG. 2 does not illustrate the fuse cell select transistor 110 of FIG. 1. Once a write operation of the fuse device 100 has been performed the select signal VSEL may be de-asserted to electrically isolate the bit line 114 from the power supply low voltage potential node VSS. As a result, FIG. 2 may illustrate the fuse device 100 following a write operation (e.g., during a read operation), at which time the bit line 114 is electrically isolated from the power supply low voltage potential node VSS.

During a read operation the word line signal VWL may be set to substantially 2.5 V above the power supply low voltage potential VSS to electrically connect the bit line 114, which may be pre-charged to a pre-charge voltage potential (e.g., the bit line voltage potential VBL is pre-charged to the pre-charge voltage potential), to the fuse cell 102. Also, a signal VSL, which may be set to the power supply low voltage potential VSS, may be provided to the fuse cell 102. To determine whether the fuse cell 102 has been blown or is unblown the voltage potential at the bit line 114 may be observed to determine how fast the voltage potential at the bit line 114 discharges toward the power supply low voltage potential VSS. Since discharge time increases with resistance (e.g., a time constant T is proportional to the electrical resistance of the fuse cell 102), the voltage potential at the bit line 114 may discharge more slowly if the fuse cell 102 is unblown than if the fuse cell 102 is blown. Accordingly, the blown or unblown state of the fuse cell 102 may be determined by measuring the voltage potential of the bit line 114 a predetermined amount of time following an assertion of the word line signal VWL to electrically connect the fuse cell 102 to the bit line 114 to begin discharge of the voltage potential of the bit line 114. If the measured voltage potential of the bit line 114 is higher than a predetermined threshold voltage potential at the predetermined period of time following the assertion of the word line signal VWL, it may be determined that the fuse cell 102 is unblown (relatively slower discharge of the bit line 114). If, on the other hand, the voltage potential of the bit line 114 is lower than the predetermined threshold voltage potential at the predetermined period of time following the assertion of the word line signal VWL, it may be determined that the fuse cell 102 is blown (relatively faster discharge of the bit line 114).

In order to conserve power, the signal VSL at the fuse cell 102 may be allowed to electrically float during a standby mode. By way of non-limiting example, the fuse device 100 may be operated in a standby mode unless the fuse cell 102 is being accessed (e.g., a write operation or a read operation is being performed).

Figure 3A:
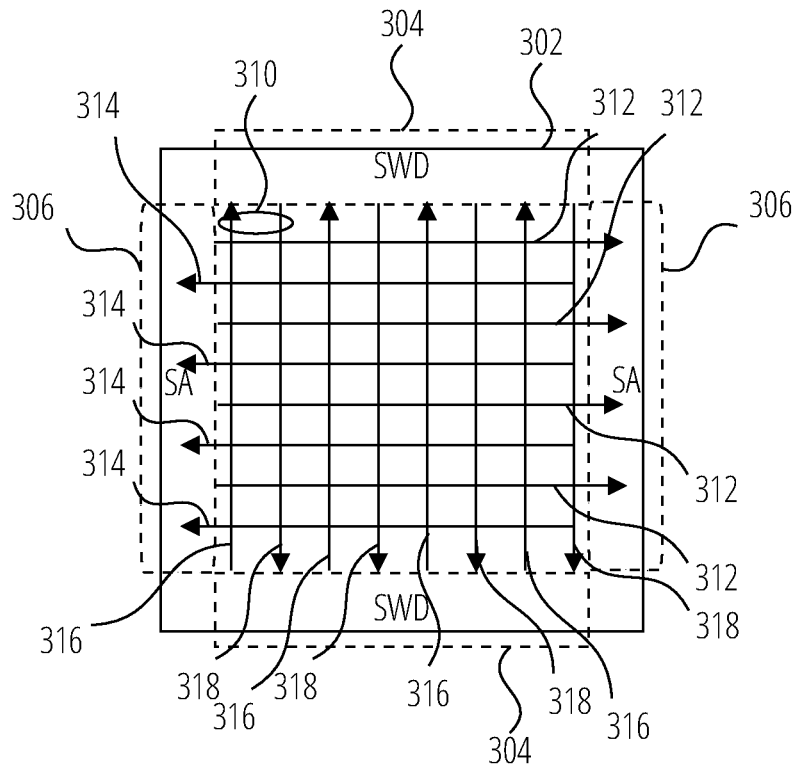
FIG. 3A is a plan view of a fuse array, according to some embodiments.

FIG. 3A is a plan view of a fuse array 302, according to some embodiments. The fuse array 302 includes word lines (even word lines 316, odd word lines 318) and bit lines (even bit lines 314, odd bit lines 312). By way of non-limiting example, the fuse array 302 includes a word line pair 310 including one of the even word lines 316 and one of the odd word lines 318. The fuse array 302 also includes fuses (e.g., similar to the fuses 202a, . . . , 202b) corresponding to intersections between the word lines and the bit lines. The word lines are electrically connected to sub-word line decoder circuitry (SWD circuitry 304) and gates of word line access transistors (e.g., the word line access transistor 108 of FIG. 1 and FIG. 2). The bit lines are electrically connected to sense amplifier circuitry 306 and the word line access transistors. The SWD circuitry 304 is configured to drive word line signals (e.g., VWL of FIG. 1 and FIG. 2) at gate terminals of word line access transistors to selectively electrically connect the bit lines to fuse cells including one or more fuses. By way of non-limiting example, the SWD circuitry 304 may be configured to drive the word line signals VWL to a logic level high (assuming the corresponding word line access transistors are NMOS transistors) during a write operation or a read operation of a fuse cell. The sense amplifier circuitry 306 is configured to compare, during a read operation, voltage potentials from the fuse cells on the bit lines to a reference voltage potential to determine whether the voltage potentials sensed on the bit lines correspond to blown or unblown fuse cells. A single end sense amplifier of the sense amplifier circuitry 306 may read data from the fuse array 302 and provide an output to latches (e.g., even latches 322 and odd latches 324 of FIG. 3B) corresponding to read fuse cells.

In FIG. 3A the sense amplifier circuitry 306 and the SWD circuitry 304 are shown using broken lines to indicate that the sense amplifier circuitry 306 and the SWD circuitry 304 are vertically offset, with reference to a semiconductor substrate (not shown) on or in which the fuse array 302 is disposed, from the fuse array 302. By way of non-limiting example, the sense amplifier circuitry 306 and the SWD circuitry 304 may be disposed in fuse circuitry 320 (FIG.

Figure 3B:
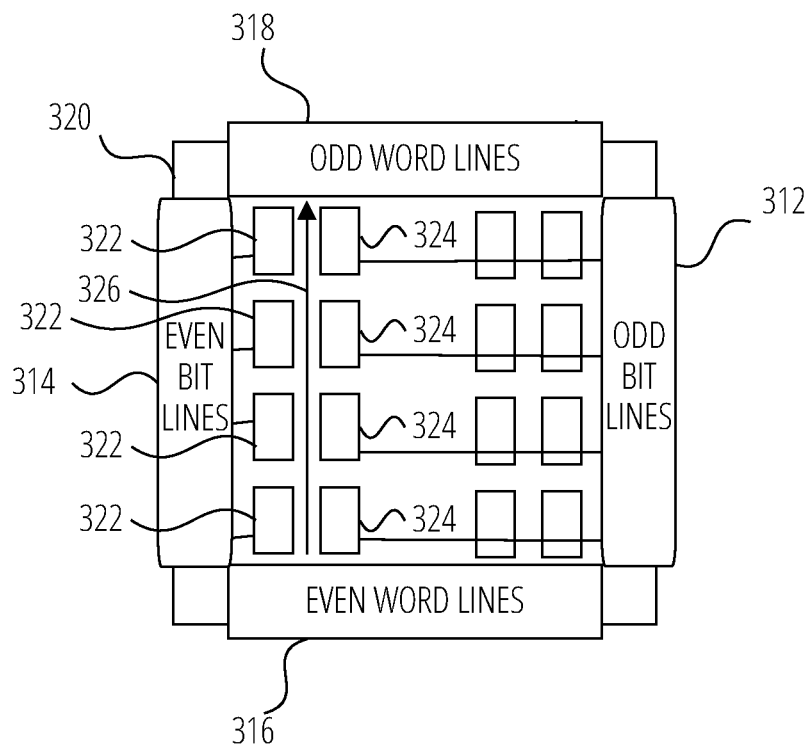
FIG. 3B is a plan view of a portion of fuse circuitry, according to some embodiments.

3B) between the semiconductor substrate and the fuse array 302. FIG. 3B illustrates additional detail of the fuse circuitry 320.

FIG. 3B is a plan view of a portion of fuse circuitry 320, according to some embodiments. The fuse circuitry 320 includes latches (e.g., even latches 322, odd latches 324) corresponding to the fuse cells including one or more of the fuses at the intersections between the word lines and the bit lines of the fuse array 302 of FIG. 3A. Referring to FIG. 3A and FIG. 3B together, the even latches 322 are electrically connected to the even bit lines 314 and the odd latches 324 are electrically connected to the odd bit lines 312.

In some embodiments each of the latches may correspond to a separate fuse cell, each including multiple fuses. In the embodiment illustrated in FIG. 3A and FIG. 3B, each latch may correspond to two fuse cells, one corresponding to one of the even bit lines 314 and one corresponding to one of the odd bit lines 312. Each assertion of a word line (e.g., to cause the word line access transistors such as word line access transistor 108 to electrically connect fuses to bit lines) may read half fuse data on one of the even bit lines 314 and half on one of the odd bit lines 312. Data from even bit lines 314 may be latched at even latches 322. Data from odd bit lines 312 may be latched at odd latches 324. By way of non-limiting example, the even word line 326 may be asserted to cause the even latches 322 and the odd latches 324 to latch data from their corresponding fuse cells.

As previously mentioned, the fuse circuitry 320 and the fuse array 302 may be offset from each other with reference to a semiconductor substrate. By way of non-limiting example, the fuse circuitry 320 may be disposed between the semiconductor substrate and the fuse array 302. Also by way of non-limiting example, the fuse array 302 may be disposed between the semiconductor substrate and the fuse circuitry 320.

Positions of the fuses of the fuse array 302 may overlap positions of their corresponding latches 322, 324 (e.g., the XY coordinates of the fuses and their corresponding latches may match). In embodiments where the fuse circuitry 320 is disposed between the semiconductor substrate and the fuse array 302, each of the fuses of the fuse array 302 may be positioned over its corresponding one of the latches 322, 324. As a result, selection signals for fuses and latches may be shared.

Figure 4:
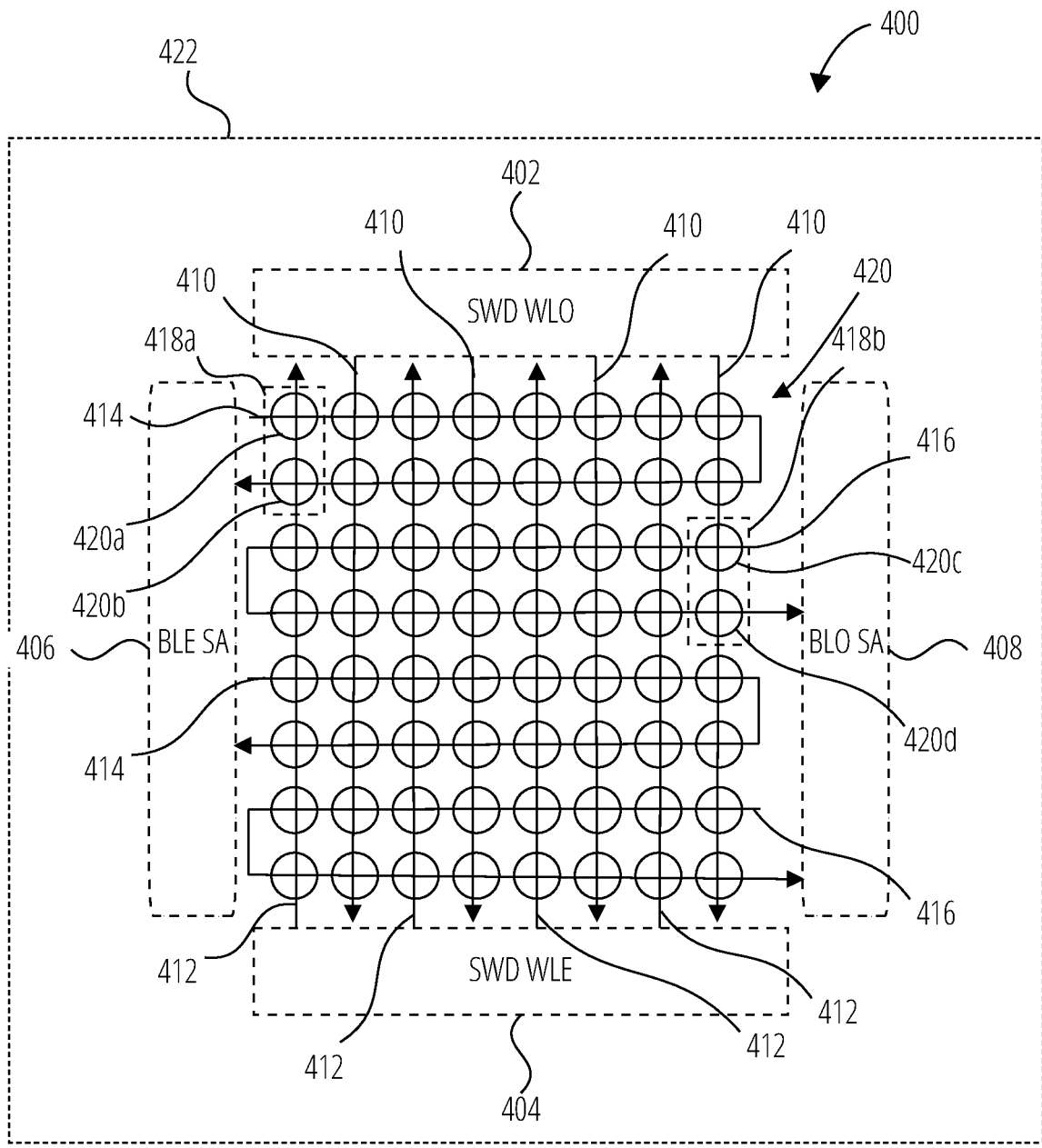
FIG. 4 is a plan view of a fuse array arranged in a folded bit line architecture, according to some embodiments.

FIG. 4 is a plan view of a fuse array 400 arranged in a folded bit line architecture, according to some embodiments. The fuse array 400 includes fuse cells 420, odd word lines 410, even word lines 412, even bit lines 414, and odd bit lines 416. FIG. 4 also illustrates, in broken lines, odd word line SWD 402, even word line SWD 404, even bit line sense amplifier 406, odd bit line sense amplifier 408, latch 418a, and latch 418b, which may be part of fuse circuitry (e.g., between a semiconductor substrate 422, shown in dotted lines, and the fuse array 400). Each of the fuse cells 420 may be similar to the fuses 202a, . . . , 202b of FIG. 2.

The latch 418a corresponds to a fuse cell including fuse 420a and fuse 420b, which are electrically connected in parallel, similar to the fuses 202a, . . . , 202b illustrated in FIG. 2. The fuse 420a and the fuse 420b are electrically connected to the same one of the even bit lines 414 via a word line access transistor (not shown, but similar to the word line access transistor 108 of FIG. 1 and FIG. 2), which is controlled by one of the even word lines 412 (the one on the far left proximate to the even bit line sense amplifier 406 of FIG. 4). Accordingly, responsive to an assertion of the one of the even word lines 412 that corresponds to the fuse 420a and the fuse 420b, the fuse 420a and the fuse 420b are electrically connected to the same one of the even bit lines 414. Thus, the fuse 420a and the fuse 420b may be accessed (e.g., written to, read from) in parallel as a single fuse cell (e.g., the fuse cell 102 of FIG. 1 and FIG. 2). As a result, even if either one of fuse 420a or fuse 420b is not successfully blown during a write operation, the fuse cell including fuse 420a and fuse 420b will still be measured by the even bit line sense amplifier 406 as blown because the parallel combination of the electrical resistances of the fuse 420a and the fuse 420b would still be sufficiently small to correspond to a blown fuse cell. The latch 418a may latch the data read by the even bit line sense amplifier 406 from the fuse cell including fuse 420a and fuse 420b.

Similarly, latch 418b corresponds to a fuse cell including fuse 420c and fuse 420d, which are electrically connected in parallel. The fuse 420c and the fuse 420d are electrically connected to the same one of the odd bit lines 416 via a word line access transistor (not shown), which is controlled by one of the odd word lines 410 (the one on the far right proximate to the odd bit line sense amplifier 408 of FIG. 4). Accordingly, responsive to an assertion of the one of the odd word lines 410 that corresponds to the fuse 420c and the fuse 420d, the fuse 420c and the fuse 420d are electrically connected to the same one of the odd bit lines 416. Thus, the fuse 420c and the fuse 420d may be accessed (e.g., written to, read from) in parallel as a single fuse cell. As a result, even if either one of fuse 420c or fuse 420d is not successfully blown during a write operation, the fuse cell including fuse 420c and fuse 420d will still be measured by the odd bit line sense amplifier 408 as blown because the parallel combination of the electrical resistances of the fuse 420c and the fuse 420d would still be sufficiently small to correspond to a blown fuse cell. The latch 418b may latch the data read by the odd bit line sense amplifier 408 from the fuse cell including fuse 420c and fuse 420d.

In some embodiments the fuse array 400 may be configured according to a two transistor, two capacitor (2T-2C) arrangement, as will be apparent to those of ordinary skill in the art.

In some embodiments the fuse array 400 may be configured in a one fuse per fuse cell arrangement. In such embodiments each of the fuse cells 420 may have its own word line access transistor connecting it to its respective one of the bit lines 414, 416. Also, in such embodiments each of the fuse cells 420 may have its own latch associated therewith.

Figure 5:
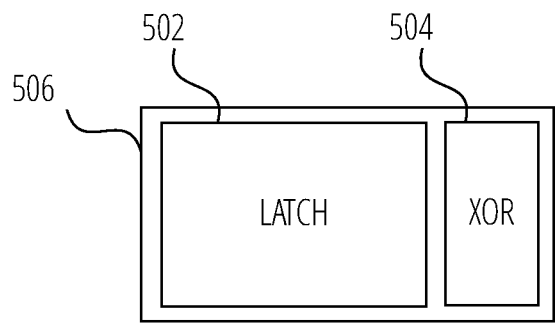
FIG. 5 is a block diagram of a latch circuit, which is an example of even latches and odd latches of FIG. 3B, or latches of FIG. 4.

FIG. 5 is a block diagram of a latch circuit 506, which is an example of the even latches 322 and the odd latches 324 of FIG. 3B, or the latch 418a and the latch 418b of FIG. 4. The latch circuit 506 includes a latch 502 configured to latch an information bit read from a fuse cell corresponding to the latch circuit 506. Since the latch circuit 506 is used in a three-dimensional fuse array architecture according to various embodiments disclosed herein, the latch 502 may include a relatively simple latch such as an SRAM latch or a D-type flipflop in contrast to a larger, more complicated latch such as a DICE latch. The relative simplicity of the latch 502 may free up sufficient chip area for additional circuitry besides the latch 502 to be included in the latch circuit 506. For example, the latch circuit 506 includes XOR circuitry 504, which may be used for address comparison. Accordingly, chip area elsewhere for the XOR circuitry 504 may be used for other circuitry, reducing the overall area covered by a fuse device (e.g., the fuse device 100) including the latch circuit 506.

Figure 6:
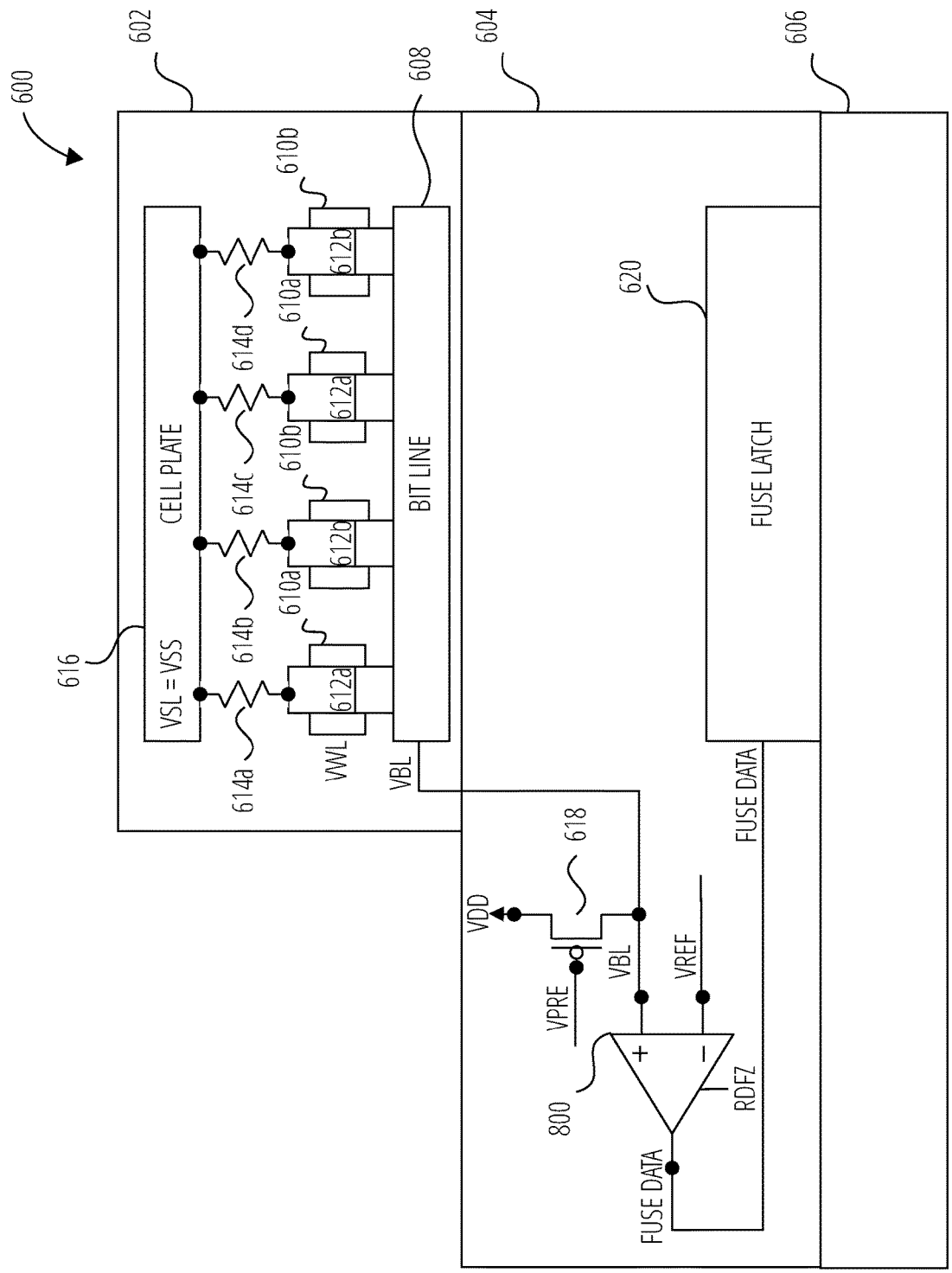
FIG. 6 is a schematic illustration of a fuse device, according to some embodiments.

FIG. 6 is a schematic illustration of a fuse device 600, according to some embodiments. The fuse device 600 includes a semiconductor substrate 606, fuse circuitry 604 on or in the semiconductor substrate 606, and a fuse array 602 on or in the semiconductor substrate 606. The fuse circuitry 604 is disposed between the semiconductor substrate 606 and the fuse array 602.

The fuse array 602 includes a cell plate 616, fuses 614 (e.g., fuse 614a, fuse 614b, fuse 614c, fuse 614d) electrically connected to the cell plate 616, a bit line 608, and word line access transistors 612 (e.g., word line access transistor 612a and word line access transistor 612b) electrically connected between the fuses 614 and the bit line 608. Word line access transistor 612a is electrically connected between the bit line 608 and fuse 614a and fuse 614c. Word line access transistor 612b is electrically connected between the bit line 608 and fuse 614b and fuse 614d. Gate terminals (not shown) of the word line access transistors 612 are electrically connected to word lines 610. For example, a gate of word line access transistor 612a is electrically connected to word line 610a. Also, a gate of word line access transistor 612b is electrically connected to word line 610b.

Since fuse 614a and fuse 614c are electrically connected to the same word line access transistor 612a, fuse 614a and fuse 614c may be part of the same fuse cell (e.g., the fuse cell 102 of FIG. 1). Also, since fuse 614b and fuse 614d are electrically connected to the same word line access transistor 612b, fuse 614b and fuse 614d may be part of the same fuse cell. As a result, two fuse cells including two fuses 614 each are illustrated in FIG. 6.

The fuses 614 may have been previously written to similarly to the write operation discussed above with reference to FIG. 1. By way of non-limiting example, fuse 614a and fuse 614c may have been blown in a previous write operation, and fuse 614b and fuse 614d may have been left unblown. Accordingly, an electrical resistance of the fuse cell including fuse 614a and fuse 614b may be relatively low (e.g., 10 kΩ//10 kΩ=5 kΩ) and an electrical resistance of the fuse cell including fuse 614b and fuse 614d may be relatively high (e.g., 1 GΩ//1 GΩ=500 MΩ).

The fuse circuitry 604 includes a bit line pre-charge transistor 618 electrically connected between a power supply voltage potential node VDD and the bit line 608. A gate of the bit line pre-charge transistor 618 is configured to receive a pre-charge control signal VPRE. The bit line pre-charge transistor 618 is configured to selectively electrically connect the bit line 608 to the power supply high voltage potential node VDD responsive to assertions of the pre-charge control signal VPRE to pre-charge a bit line voltage potential VBL of the bit line 608 to a power supply high voltage potential VDD. The term VDD is used herein to refer to both the power supply high voltage potential VDD and the power supply high voltage potential node VDD and the distinction will be clear from the context of its use.

Figure 8:
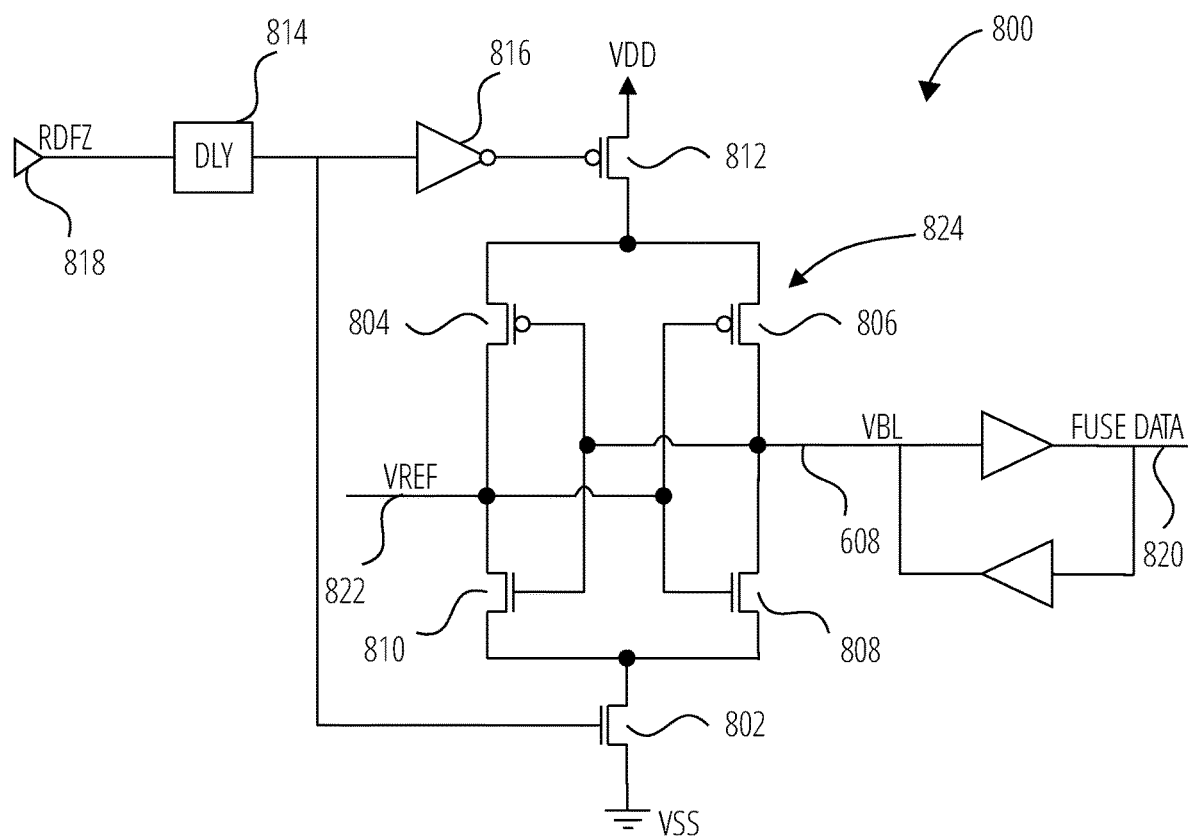
FIG. 8 is a schematic illustration of an example of a sense amplifier of FIG. 6.

The fuse circuitry 604 also includes a sense amplifier 800 configured to compare the bit line voltage potential VBL to a reference voltage potential VREF to read a bit stored to a fuse cell (e.g., the fuse cell associated with fuse 614a and fuse 614c, the fuse cell associated with fuse 614b and fuse 614d). By way of non-limiting example, the sense amplifier 800 may be configured to output a fuse data signal FUSE DATA configured to indicate whether the bit line voltage potential VBL is higher than the reference voltage potential VREF (e.g., corresponding to a digital "1") or lower than the reference voltage potential VREF (e.g., corresponding to a digital "0"). The sense amplifier 800 may be activated or deactivated responsive to a read fuse control signal RDFZ. By way of non-limiting example, the sense amplifier 800 may include a complementary metal oxide semiconductor (CMOS) comparator. An example of the sense amplifier 800 is illustrated in FIG. 8.

The fuse circuitry 604 further includes a fuse latch 620 corresponding to a fuse cell including fuse 614a and fuse 614c. The fuse circuitry 604 is configured to receive the fuse data signal FUSE DATA output by the sense amplifier 800 responsive to reading the fuse cell including fuse 614a and fuse 614c and latch a bit indicated by the fuse data signal FUSE DATA. Accordingly, when the bit stored by the fuse cell is later desired, the bit may be obtained by accessing the fuse latch 620 because the bit is latched to the fuse latch 620.

The fuse latch 620 may be similar to the latch circuit 506 of FIG. 5. By way of non-limiting example, the fuse latch 620 may include an SRAM latch. Also by way of non-limiting example, the fuse latch 620 may include a D-type flipflop. Because of the three-dimensional fuse architecture of the fuse device 600, the fuse latch 620 may be simpler and/or smaller than a DICE latch, which, as discussed above, reduces chip area used by the fuse device 600 as compared to that of fuse devices using two-dimensional fuse architectures.

In a read operation of the fuse cell including fuse 614a and fuse 614c the bit line 608 may be pre-charged to the power supply high voltage potential VDD. For example, an assertion of the pre-charge control signal VPRE may cause the bit line pre-charge transistor 618 to electrically connect the bit line 608 to the power supply high voltage potential node VDD. The pre-charge control signal may be de-asserted to electrically isolate the bit line 608 from the power supply high voltage potential node once the bit line voltage potential VBL is pre-charged to the power supply high voltage potential VDD. A power supply low voltage potential VSS is provided to the cell plate 616. Once the bit line voltage potential VBL is pre-charged to the power supply high voltage potential VDD and the power supply low voltage potential VSS is provided to cell plate 616 a word line signal VWL on the word line 610a is asserted, electrically connecting fuse 614a and fuse 614c to the bit line 608. Since the fuse 614a and the fuse 614c have been blown, a resistance of the fuse cell including fuse 614a and fuse 614c is relatively low. As a result, the bit line voltage potential VBL on the bit line 608 discharges relatively quickly, as compared to the case that the resistance of the fuse cell were relatively high (i.e., in an unblown state).

A predetermined period of time following the assertion of the word line signal VWL, the read fuse signal RDFZ is asserted to activate the sense amplifier 800. The predetermined period of time is selected to be sufficient for a blown fuse cell to discharge the bit line voltage potential VBL below the reference voltage potential VREF, but insufficient for an unblown fuse cell to discharge the bit line voltage potential VBL below the reference voltage potential VREF. Since in this case the fuse cell including fuse 614a and fuse 614c has been blown, the bit line signal VBL may have discharged to less than the reference voltage potential VREF when the read fuse signal RDFZ is asserted. As a result, the sense amplifier 800 may output the fuse data signal FUSE DATA at a logic level low voltage potential, corresponding to a "0" bit stored by the fuse cell including fuse 614a and fuse 614c. The sense amplifier 800 may provide the fuse data signal FUSE DATA to the fuse latch 620, and the fuse latch 620 may latch the "0" bit for later use.

It is noted that although the fuse circuitry 604 is illustrated in FIG. 6 between the fuse array 602 and the semiconductor substrate 606, in some embodiments the fuse array 602 may instead be disposed between the fuse circuitry 604 and the semiconductor substrate 606 without departing from the scope of the disclosure.

Figure 7:
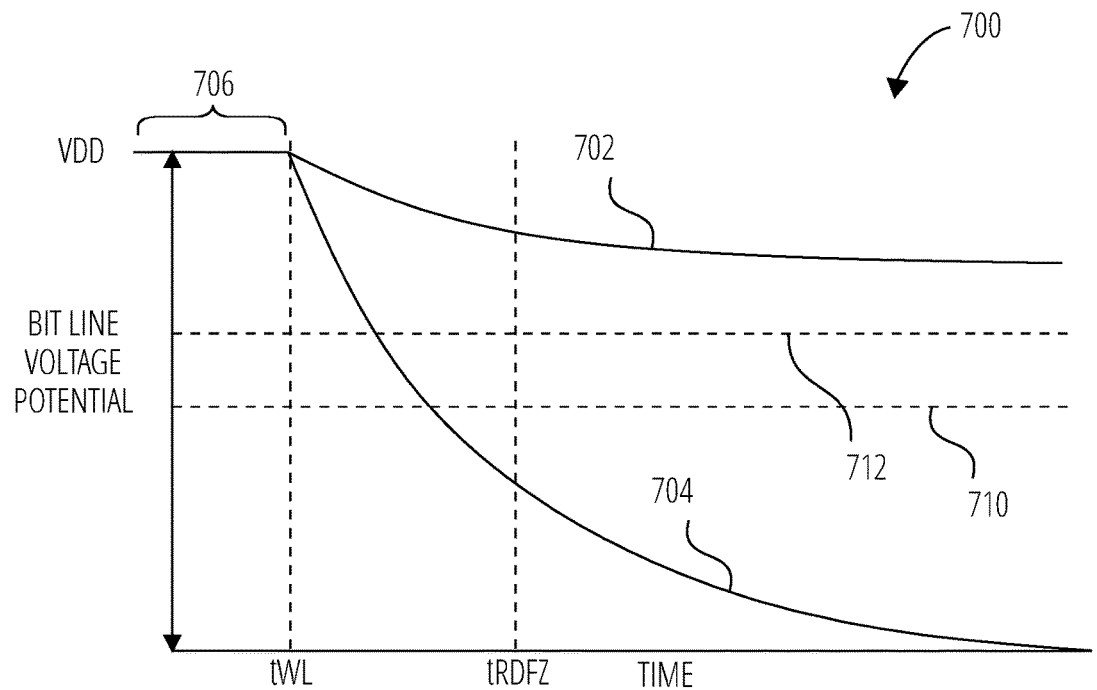
FIG. 7 is a plot of bit line voltage potentials during a read operation of the fuse device of FIG. 6.

FIG. 7 is a plot 700 of bit line voltage potentials during a read operation of the fuse device 600 of FIG. 6. The plot 700 includes an unblown bit line voltage potential 702 and a blown bit line voltage potential 704 plotted over time. Referring to FIG. 6 and FIG. 7 together, the unblown bit line voltage potential 702 corresponds to the bit line voltage potential VBL on the bit line 608 of responsive to a read operation where the fuse cell including fuse 614a and fuse 614b is unblown. The blown bit line voltage potential 704 corresponds to the bit line voltage potential VBL on the bit line 608 responsive to a read operation where the fuse cell including fuse 614a and fuse 614b is blown. As illustrated in FIG. 7, due to the higher electrical resistance of the unblown fuse cell as compared to the blown fuse cell, the unblown bit line voltage potential 702 discharges more slowly than the blown bit line voltage potential 704.

The plot 700 also illustrates a first threshold voltage potential 710 and a second threshold voltage potential 712, which correspond to different levels of the reference voltage potential VREF provided to the sense amplifier 800. In some embodiments the reference voltage potential VREF may be electrically controllable. By way of non-limiting example, the reference voltage potential VREF may be set to a first threshold voltage potential 710 corresponding to substantially ½ times the power supply high voltage potential VDD or to a second threshold voltage potential 712 corresponding to substantially ⅔ times the power supply high voltage potential VDD. In some embodiments the reference voltage potential VREF may be set to be relatively low (e.g., the first threshold voltage potential 710) responsive to a relatively fast discharge of the blown bit line voltage potential 704. In some embodiments the reference voltage potential VREF may be set to be relatively high (e.g., the second threshold voltage potential 712) responsive to a relatively slow discharge of the blown bit line voltage potential 704. Setting the reference voltage potential VREF relatively high (e.g., second threshold voltage potential 712) provides a larger time margin between a point in time where the blown bit line voltage potential 704 falls below the reference voltage potential VREF and the read fuse time tRDFZ. This larger time margin enables the blown bit line voltage potential 704 to discharge further below the reference voltage potential VREF than a smaller reference voltage potential VREF. In the case where one of fuse 614a and fuse 614c fails to blow properly, in which case the blown bit line voltage potential 704 may discharge relatively slowly, the larger reference voltage potential VREF may reduce the risk of the blown bit line voltage potential 704 not falling below the reference voltage potential VREF before the read fuse time tRDFZ. The timing of the read fuse time tRDFZ may also be adjustable to provide sufficient margin (e.g., time and voltage margin) to avoid errors in reading the fuse cell, as will be discussed in more detail with reference to FIG. 8.

In the case of an unblown fuse cell, during a pre-charge period of time 706 the unblown bit line voltage potential 702 has been pre-charged to VDD (e.g., responsive to an assertion of the bit line pre-charge control signal VPRE). At a word line assert time tWL, however, the word line signal VWL corresponding to the fuse cell is asserted, electrically connecting the bit line 608 to the cell plate 616 through the fuse cell (i.e., through fuse 614a and fuse 614b). The unblown bit line voltage potential 702 decreases slowly as the blown bit line voltage potential 704 discharges through the relatively high electrical resistance of the unblown fuse cell. At a read fuse time tRDFZ the read fuse signal RDFZ is asserted, and the sense amplifier 800 compares the unblown bit line voltage potential 702 to the reference voltage potential VREF (e.g., first threshold voltage potential 710, second threshold voltage potential 712). Since the unblown bit line voltage potential 702 is greater than the reference voltage potential VREF at tRDFZ the sense amplifier 800 may output the fuse data signal FUSE DATA at a logic level high voltage potential, which is latched by the fuse latch 620.

In the case of an unblown fuse cell, during the pre-charge period of time 706 the blown bit line voltage potential 704 has been pre-charged to VDD. At the word line assert time tWL, however, the word line signal VWL corresponding to the fuse cell is asserted, electrically connecting the bit line 608 to the cell plate 616 through the fuse cell (i.e., through fuse 614a and fuse 614c). The blown bit line voltage potential 704 decreases relatively quickly as the pre-charge period of time 706 discharges through the relatively low electrical resistance of the blown fuse cell. At the read fuse time tRDFZ the read fuse signal RDFZ is asserted, and the sense amplifier 800 compares the blown bit line voltage potential 704 to the reference voltage potential VREF (e.g., first threshold voltage potential 710, second threshold voltage potential 712). Since the blown bit line voltage potential 704 is less than the reference voltage potential VREF at tRDFZ the sense amplifier 800 may output the fuse data signal FUSE DATA at a logic level low voltage potential, which is latched by the fuse latch 620.

FIG. 8 is a schematic illustration of an example of the sense amplifier 800 of FIG. 6. Referring to FIG. 6 and FIG. 8 together, the sense amplifier 800 includes an activation input 818, the bit line 608, a reference input 822, and a sense amplifier output 820. The activation input 818 is configured to receive the read fuse signal RDFZ. The bit line 608 is configured to provide, to the sense amplifier 800 the bit line voltage potential VBL. The reference input 822 is configured to receive the reference voltage potential VREF. The sense amplifier output 820 is configured to provide, to the fuse latch 620, the fuse data signal FUSE DATA.

The sense amplifier 800 includes a pull-up transistor 804, a pull-up transistor 806, a pull-down transistor 808, and a pull-down transistor 810 arranged as a CMOS amplifier 824 configured to amplify the bit line voltage potential VBL provided on the bit line 608 relative to the reference voltage potential VREF provided at the reference input 822. As a result, the sense amplifier 800 may operate as a CMOS comparator that toggles the fuse data signal FUSE DATA at the sense amplifier output 820 to a digital level "0" if the fuse cell is blown, but keeps the fuse data signal FUSE DATA at a digital level "1" if the fuse cell is unblown.

Power supply voltage potentials (power supply low voltage potential VSS and power supply high voltage potential VDD) may be selectively provided to the CMOS amplifier 824 responsive to an assertion of the read fuse signal RDFZ received at the activation input 818. Providing power to the CMOS amplifier 824 may activate the CMOS amplifier 824, and by extension, the sense amplifier 800. Specifically, the sense amplifier 800 includes a delay element 814, an activation inverter 816, a PMOS activation transistor 812, and an NMOS activation transistor 802. When the read fuse signal RDFZ is asserted to activate the sense amplifier 800, the delay element 814 may delay activation of the sense amplifier 800 for a predetermined period of time following the assertion of the read fuse signal RDFZ. The delayed read fuse signal RDFZ may then cause the NMOS activation transistor 802 and the PMOS activation transistor 812 to conduct. For example, the delayed read fuse signal RDFZ may be applied to a gate terminal of the NMOS activation transistor 802, causing the NMOS activation transistor 802 to electrically connect the CMOS amplifier 824 to the power supply voltage potential node VSS. Also, the delayed read fuse signal RDFZ may be applied to the activation inverter 816, which inverts the delayed read fuse signal RDFZ and provides the inverted read fuse signal RDFZ to a gate terminal of the PMOS activation transistor 812, which may cause the PMOS activation transistor 812 to electrically connect the CMOS amplifier 824 to the power supply high voltage potential node VDD.

An amount of delay built into the delay element 814 may be selected to set the read fuse time tRDFZ (FIG. 7) to an appropriate time to allow an unblown bit line voltage potential 702 (FIG. 7) to fall below the reference voltage potential VREF. For example, a relatively long delay may provide more time for the blown bit line voltage potential 704 to discharge below the reference voltage potential VREF. A relatively short delay may provide less time for the blown bit line voltage potential 704 to discharge, but may provide for faster read operations (less delay provides faster read time). As a result, a balance between fast read operation and reliability of detection of the blown bit line voltage potential 704 below the reference voltage potential VREF should be maintained based on parameters of the fuse device 600 (e.g., the resistance of the fuse cell) and design constraints (e.g., required operation speed).

Figure 9:
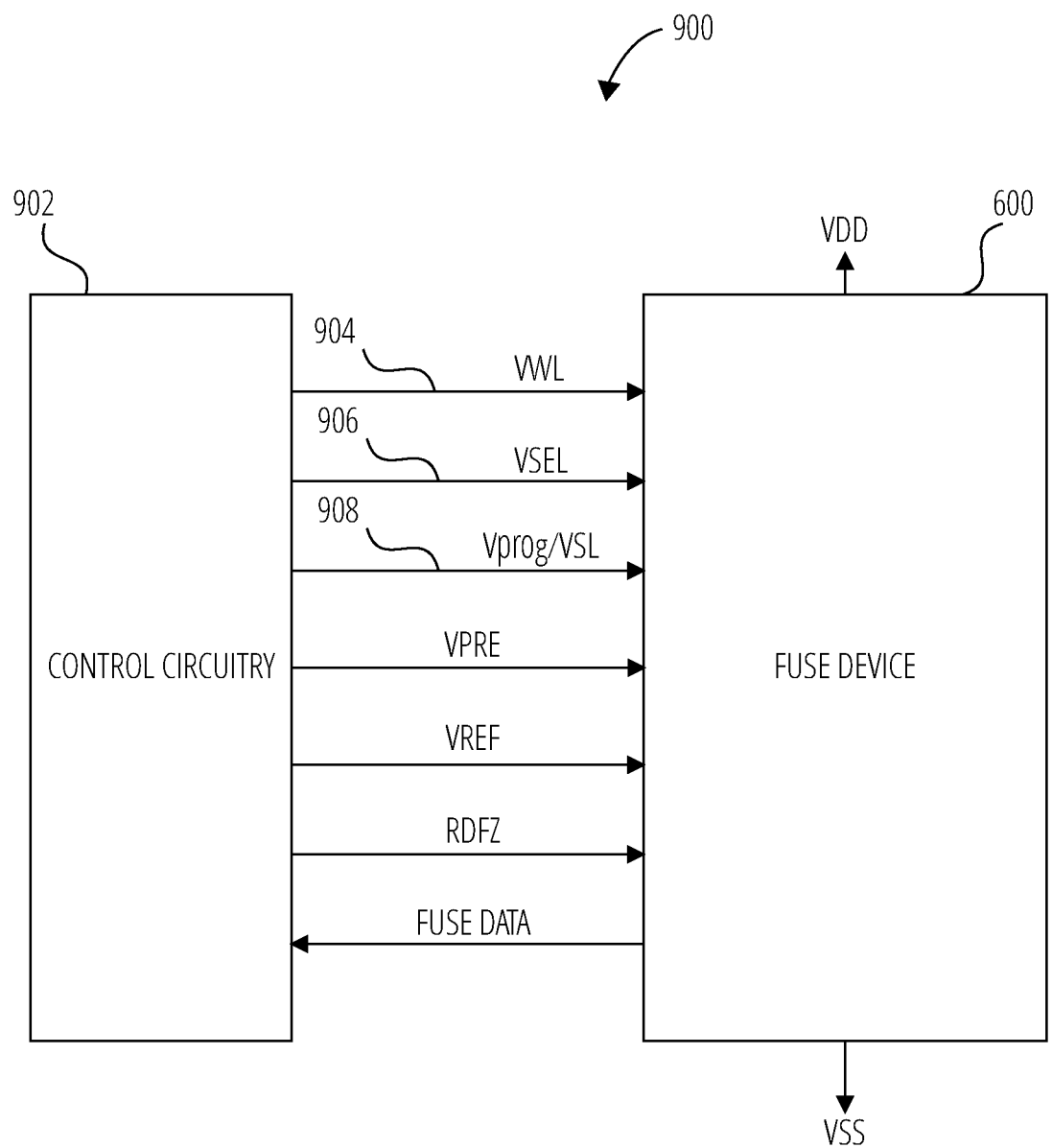
FIG. 9 is a block diagram of a memory device, according to some embodiments.

FIG. 9 is a block diagram of a memory device 900, according to some embodiments. The memory device 900 includes the fuse device 600 of FIG. 6 and control circuitry 902. The control circuitry 902 is configured to control the fuse device 600. By way of non-limiting example, the control circuitry 902 may be electrically connected to the fuse device 600 via one or more word lines 904, one or more select lines 906, and one or more cell plate lines 908. The fuse device 600 may include one or more fuse arrays (e.g., fuse array 602) configured to store information bits.

The control circuitry 902 may be configured to trigger and execute write operations and read operations on the fuse arrays of the fuse device 600. For example, during a write operation the control circuitry 902 may provide a program voltage potential Vprog to the fuse device 600 via the cell plate lines 908, which are electrically connected to one or more cell plates (e.g., cell plate 616 of FIG. 6). The control circuitry 902 may assert select voltage potentials VSEL on the select lines 906 to electrically connect bit lines (e.g., bit line 114, bit line 608) to VSS during write operations. The control circuitry 902 may also assert select word line signals VWL on the word lines 904 to access corresponding fuse cells during the write operations. More specifics regarding write operations are discussed with reference to FIG. 1.

During read operations the control circuitry 902 may provide signals VSL (e.g., set to VSS) to cell plates of the fuse device 600 via the cell plate lines 908. The control circuitry 902 may also provide access to select fuse cells via word line signals VWL on the word lines 904. The control circuitry 902 may further electrically isolate the bit lines from VSS by de-asserting the select voltage potentials VSEL on the select lines 906. The control circuitry 902 may enable the read operations further by providing one or more reference voltage potentials VREF, one or more pre-charge control signals VPRE, and one or more read fuse signals RDFZ. The read fuse data FUSE DATA from the fuse cells may be latched to latches (e.g., fuse latch 620 of FIG. 6). The fuse data FUSE DATA may be provided by the fuse device 600 to the control circuitry 902 (e.g., control circuitry 902 may access FUSE DATA latched to the fuse latches). More detail regarding read operations is discussed above with reference to FIG. 2, FIG. 6, FIG. 7, and FIG. 8.

During a standby mode the control circuitry 902 may be configured to allow the cell plate lines to electrically float to conserver power.

As previously discussed, the fuse device 600 may include a fuse array 602, fuse circuitry 604, and a semiconductor substrate 606 (FIG. 6). The fuse circuitry 604 may be disposed between the semiconductor substrate 606 and the fuse array 602 in some embodiments. The fuse array 602 may be disposed between the semiconductor substrate 606 and the fuse circuitry 604 in some embodiments. In some embodiments the control circuitry 902 may be implemented with the fuse circuitry (e.g., the control circuitry 902 may be disposed between the semiconductor substrate 606 and the fuse array 602 with the fuse circuitry 604).

Figure 10:
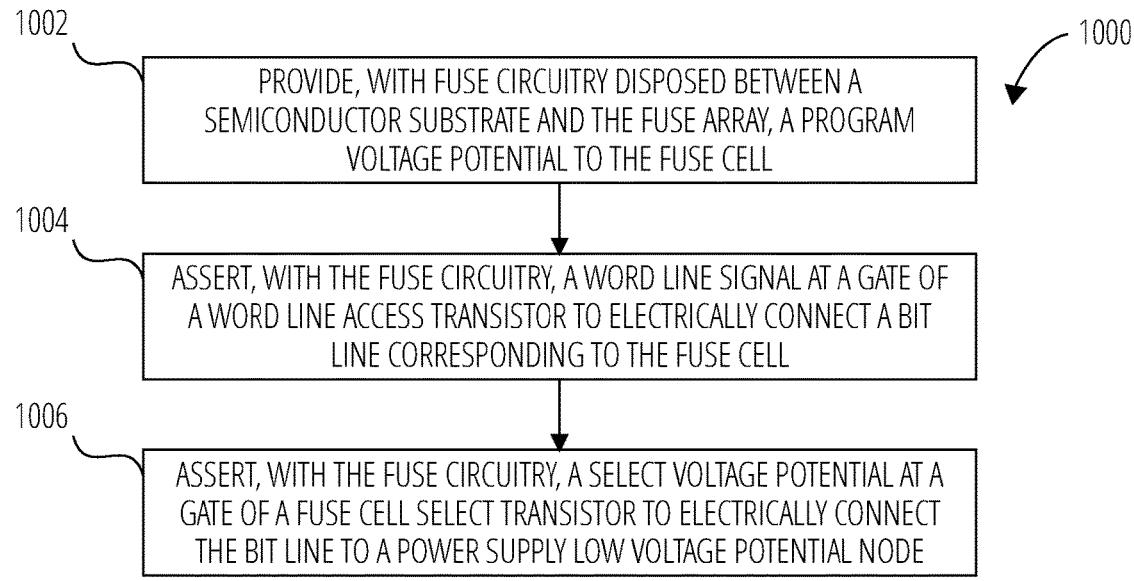
FIG. 10 is a flowchart illustrating a method of blowing a fuse cell of a fuse array, according to some embodiments.

FIG. 10 is a flowchart illustrating a method 1000 of blowing a fuse cell of a fuse array, according to some embodiments. At operation 1002, method 1000 includes providing, with fuse circuitry disposed between a semiconductor substrate and the fuse array, a program voltage potential to the fuse cell. At operation 1004, method 1000 includes asserting, with the fuse circuitry, a word line signal at a gate terminal of a word line access transistor to electrically connect a bit line corresponding to the fuse cell. In some embodiments asserting the word line signal at the gate terminal of the word line access transistor to electrically connect the bit line to the fuse cell includes electrically connecting the bit line to two or more fuses of the fuse cell with the fuses of the fuse cell electrically connected in parallel with each other. At operation 1006, method 1000 includes asserting, with the fuse circuitry, a select voltage potential at a gate terminal of a fuse cell select transistor to electrically connect the bit line to a power supply low voltage potential node.

Figure 11:
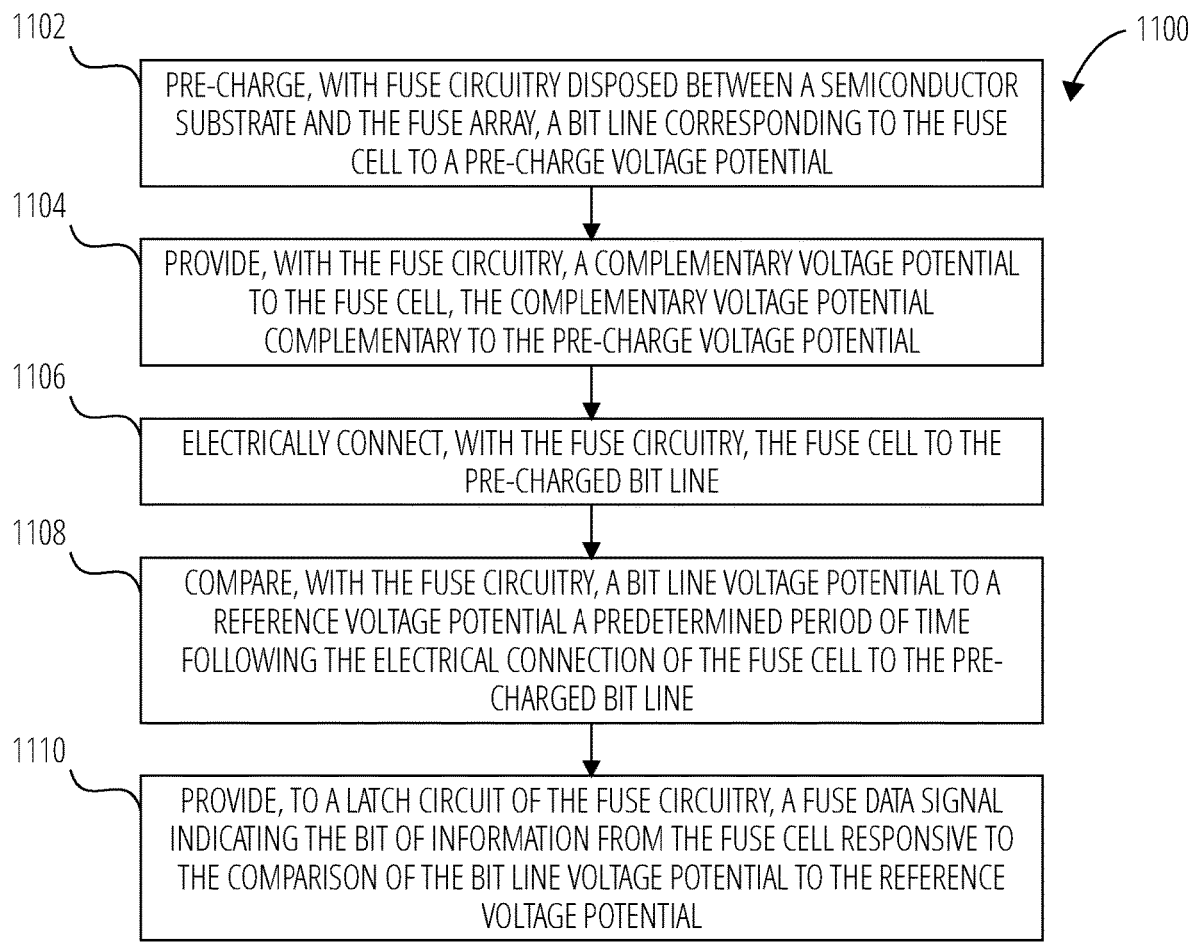
FIG. 11 is a flowchart illustrating a method of reading a bit of information from a fuse cell of a fuse array, according to some embodiments.

FIG. 11 is a flowchart illustrating a method 1100 of reading a bit of information from a fuse cell of a fuse array, according to some embodiments. At operation 1102, method 1100 includes pre-charging, with fuse circuitry disposed between a semiconductor substrate and the fuse array, a bit line corresponding to the fuse cell to a pre-charge voltage potential. At operation 1104, method 1100 includes providing, with the fuse circuitry, a complementary voltage potential to the fuse cell, the complementary voltage potential complementary to the pre-charge voltage potential. As used herein, the term "complementary voltage potential" indicates that the complementary voltage potential is at a logic level that is opposite to that of a voltage potential that the complementary voltage potential is complementary to. For example, if the voltage potential is corresponds to a "1" (e.g., a logic level high voltage potential), the complementary voltage potential may correspond to a "0" (e.g., a logic level low voltage potential). In this case the pre-charge voltage potential may be set to a power supply high voltage potential VDD, which may correspond to a "1" or a logic level high voltage potential. Accordingly, the complementary voltage potential, which is complementary to the pre-charge voltage potential, may be a "0" (e.g., a logic level low voltage potential), such as the power supply low voltage potential VSS. It is contemplated within the scope of the disclosure, however, that the pre-charge voltage potential may instead be a "0" (e.g., VSS) and the complementary voltage potential may be a "1" (e.g., VDD). In some embodiments, providing the complementary voltage potential to the fuse cell includes providing the complementary voltage potential to two or more fuses of the fuse cell, the fuses of the fuse cell electrically connected in parallel with each other.

At operation 1106, method 1100 includes electrically connecting, with the fuse circuitry, the fuse cell to the pre-charged bit line. At operation 1108, method 1100 includes comparing, with the fuse circuitry, a bit line voltage potential to a reference voltage potential a predetermined period of time following the electrical connection of the fuse cell to the pre-charged bit line. In some embodiments the reference voltage potential may be adjusted. At operation 1110, method 1100 includes providing, to a latch circuit of the fuse circuitry, a fuse data signal indicating the bit of information from the fuse cell responsive to the comparison of the bit line voltage potential to the reference voltage potential. In some embodiments providing the fuse data signal responsive to the comparison includes delaying a trigger configured to trigger the comparison.

Figure 12:
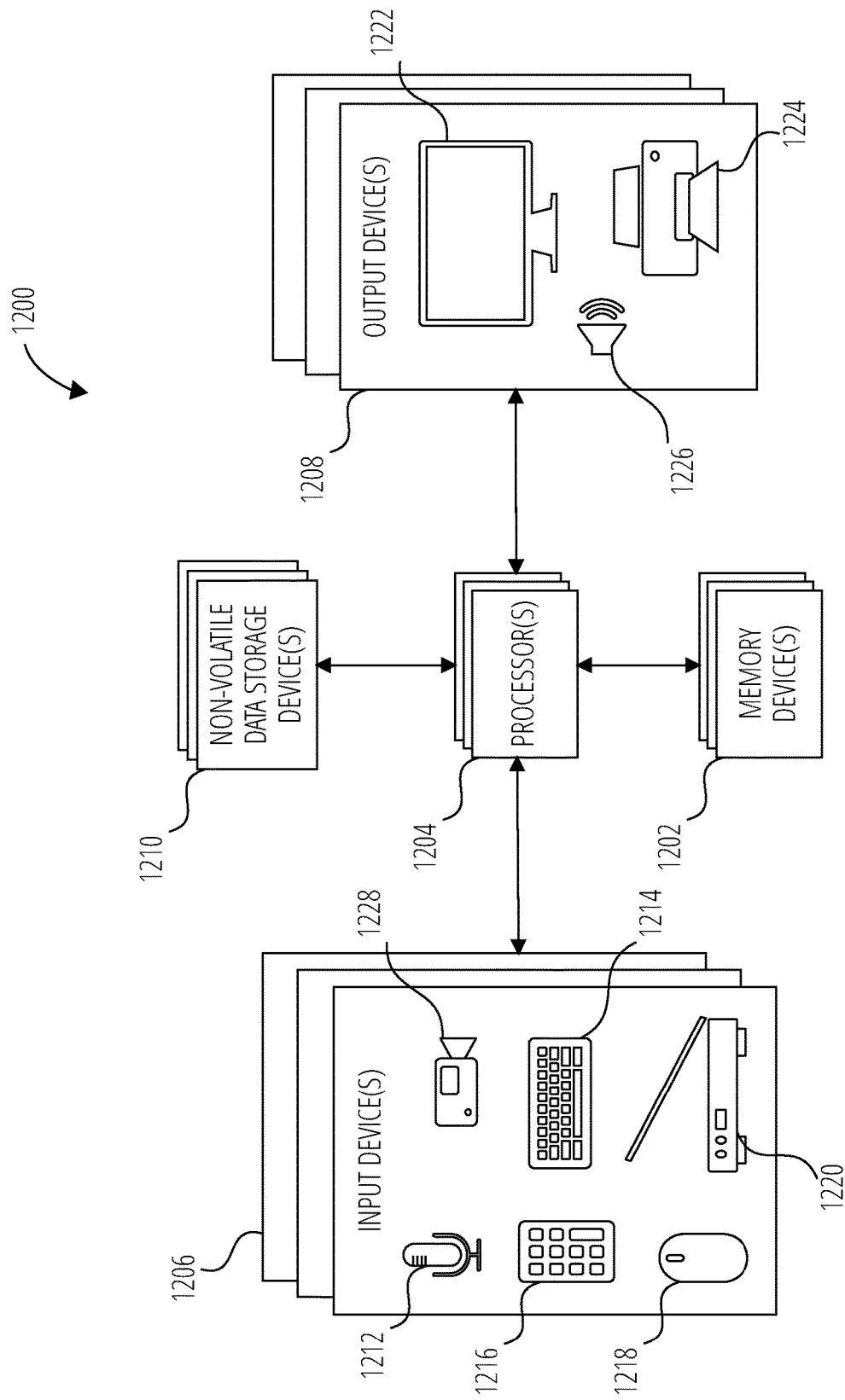
FIG. 12 is a block diagram of a computing system, according to some embodiments.

FIG. 12 is a block diagram of a computing system 1200, according to some embodiments. The computing system 1200 includes one or more processors 1204 electrically connected to one or more memory devices 1202, one or more non-volatile data storage devices 1210, one or more input devices 1206, and one or more output devices 1208. In some embodiments the computing system 1200 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1204 may include a central processing unit (CPU) or other processor configured to control the computing system 1200. In some embodiments the one or more memory devices 1202 include random access memory (RAM), such as volatile data storage (e.g., dynamic RAM (DRAM) static RAM (SRAM), etc.). In some embodiments the one or more non-volatile data storage devices 1210 include a hard drive, a solid state drive, Flash memory, erasable programmable read only memory (EPROM), other non-volatile data storage devices, or any combination thereof. In some embodiments the one or more input devices 1206 include a keyboard 1214, a pointing device 1218 (e.g., a mouse, a track pad, etc.), a microphone 1212, a keypad 1216, a scanner 1220, a camera 1228, other input devices, or any combination thereof. In some embodiments the output devices 1208 include an electronic display 1222, a speaker 1226, a printer 1224, other output devices, or any combination thereof.

The one or more memory devices 1202 may include the memory device 900 of FIG. 9. For example, the memory devices 1202 may include at least one fuse device 600 (FIG. 6) having a three-dimensional fuse architecture according to embodiments disclosed herein. For example, the one or more memory devices 1202 may include a fuse device including a semiconductor substrate, a fuse array on or in the semiconductor substrate, and fuse circuitry configured to access a fuse cell of the fuse array. The fuse circuitry is disposed between the semiconductor substrate and the fuse array.

Figure 13:
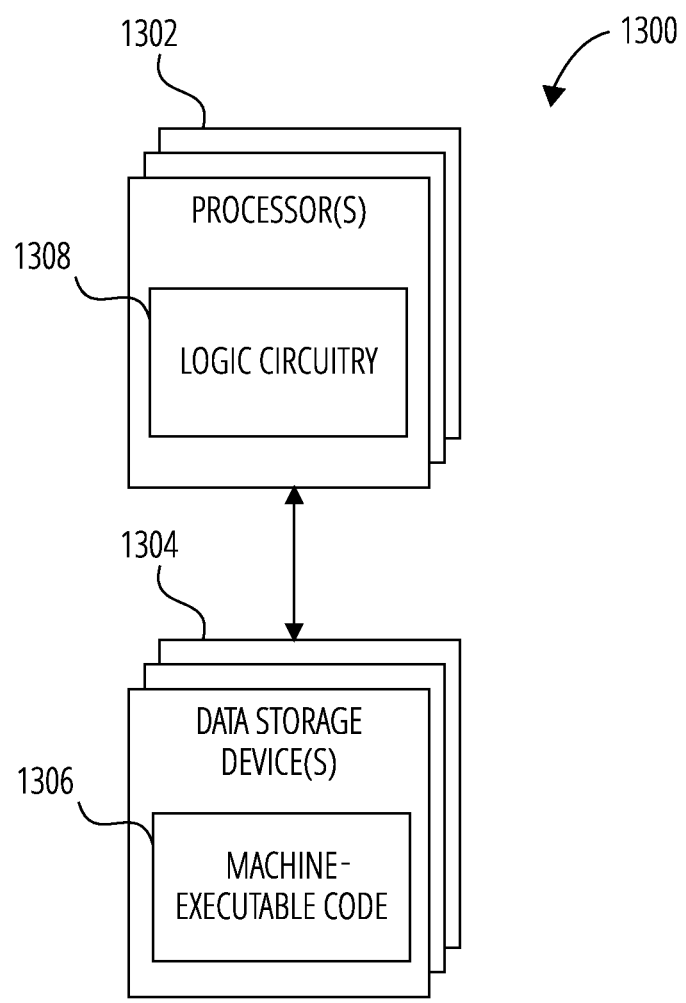
FIG. 13 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 13 illustrates non-limiting examples of implementations of functional elements disclosed herein. In some embodiments, some or all portions of the functional elements disclosed herein may be performed by hardware specially configured for carrying out the functional elements.

FIG. 13 is a block diagram of circuitry 1300 that, in some embodiments, may be used to implement various functions, operations, acts, processes, and/or methods disclosed herein. The circuitry 1300 includes one or more processors 1302 (sometimes referred to herein as "processors 1302") operably coupled to one or more data storage devices (sometimes referred to herein as "storage 1304"). The storage 1304 includes machine-executable code 1306 stored thereon and the processors 1302 include logic circuitry 1308. The machine-executable code 1306 includes information describing functional elements that may be implemented by (e.g., performed by) the logic circuitry 1308. The logic circuitry 1308 is adapted to implement (e.g., perform) the functional elements described by the machine-executable code 1306. The circuitry 1300, when executing the functional elements described by the machine-executable code 1306, should be considered as special purpose hardware configured for carrying out functional elements disclosed herein. In some embodiments the processors 1302 may be configured to perform the functional elements described by the machine-executable code 1306 sequentially, concurrently (e.g., on one or more different hardware platforms), or in one or more parallel process streams.

When implemented by logic circuitry 1308 of the processors 1302, the machine-executable code 1306 is configured to adapt the processors 1302 to perform operations of embodiments disclosed herein. For example, the machine-executable code 1306 may be configured to adapt the processors 1302 to perform at least a portion or a totality of the method 1000 of FIG. 10 and/or the method 1100 of FIG. 11. As another example, the machine-executable code 1306 may be configured to adapt the processors 1302 to perform at least a portion or a totality of the operations discussed for the control circuitry 902 of FIG. 9. As a specific, non-limiting example, the machine-executable code 1306 may be configured to adapt the processors 1302 to provide various signals (e.g., VWL, VSEL, Vprog, VSL, VPRE, VREF, RDFZ, FUSE DATA of FIG. 9) to a fuse device 600 (FIG. 9), access bits of fuse data FUSE DATA stored in latches of a fuse device 600, other operations disclosed herein, or combinations thereof.

The processors 1302 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1306 (e.g., software code, firmware code, hardware descriptions) related to embodiments of the present disclosure. It is noted that a general-purpose processor (may also be referred to herein as a host processor or simply a host) may be a microprocessor, but in the alternative, the processors 1302 may include any conventional processor, controller, microcontroller, or state machine. The processors 1302 may also be implemented as a combination of computing devices, such as a combination of a DSP and a microprocessor, a one or more microprocessors, one or more microprocessors in conjunction with a DSP core, or any other such configuration.

In some embodiments the storage 1304 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 1302 and the storage 1304 may be implemented into a single device (e.g., a semiconductor device product, a system on chip (SOC), etc.). In some embodiments the processors 1302 and the storage 1304 may be implemented into separate devices.

In some embodiments the machine-executable code 1306 may include computer-readable instructions (e.g., software code, firmware code). By way of non-limiting example, the computer-readable instructions may be stored by the storage 1304, accessed directly by the processors 1302, and executed by the processors 1302 using at least the logic circuitry 1308. Also by way of non-limiting example, the computer-readable instructions may be stored on the storage 1304, transferred to a memory device (not shown) for execution, and executed by the processors 1302 using at least the logic circuitry 1308. Accordingly, in some embodiments the logic circuitry 1308 includes electrically configurable logic circuitry 1308.

In some embodiments the machine-executable code 1306 may describe hardware (e.g., circuitry) to be implemented in the logic circuitry 1308 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, System-Verilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1308 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine-executable code 1306 may include an HDL, an RTL, a GL description, a mask level description, other hardware description, or any combination thereof.

In embodiments where the machine-executable code 1306 includes a hardware description (at any level of abstraction), a system (not shown, but including the storage 1304) may be configured to implement the hardware description described by the machine-executable code 1306. By way of non-limiting example, the processors 1302 may include a programmable logic device (e.g., an FPGA or a PLC) and the logic circuitry 1308 may be electrically controlled to implement circuitry corresponding to the hardware description into the logic circuitry 1308. Also by way of non-limiting example, the logic circuitry 1308 may include hard-wired logic manufactured by a manufacturing system (not shown, but including the storage 1304) according to the hardware description of the machine-executable code 1306.

Regardless of whether the machine-executable code 1306 includes computer-readable instructions or a hardware description, the logic circuitry 1308 is adapted to perform the functional elements described by the machine-executable code 1306 when implementing the functional elements of the machine-executable code 1306. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a number of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a semiconductor substrate;
   a fuse array over the semiconductor substrate, the fuse array including fuse cells; and
   a fuse circuitry over the semiconductor substrate, the fuse circuitry configured to access the fuse cells, the fuse circuitry offset from the fuse array such that:
      the fuse circuitry is disposed between the semiconductor substrate and the fuse array; or
      the fuse array is disposed between the semiconductor substrate and the fuse circuitry.

2. The apparatus of claim 1, wherein the fuse circuitry is disposed between the fuse array and the semiconductor substrate.

3. The apparatus of claim 1, wherein the fuse array is disposed between the fuse circuitry and the semiconductor substrate.

4. The apparatus of claim 1, wherein the fuse circuitry includes latches configured to latch data bits read from the fuse cells.

5. The apparatus of claim 4, wherein the latches comprise static random access memory (SRAM) latches.

6. The apparatus of claim 1, wherein at least one fuse cell of the fuse cells includes two or more fuse elements electrically connected in parallel.

7. The apparatus of claim 6, wherein the two or more fuse elements include anti-fuse elements.

8. The apparatus of claim 6, wherein the two or more fuse elements include metal oxide semiconductor field effect transistor (MOSFET) capacitors.

9. The apparatus of claim 6, further comprising separate word line access transistors electrically connected to the two or more fuse elements to separately control access to the two or more fuse elements.

10. The apparatus of claim 1, wherein the fuse circuitry includes a sense amplifier configured to output fuse data indicating a bit of information read from a fuse cell responsive to a comparison between a reference voltage potential and a bit line voltage potential of a bit line corresponding to the fuse cell.

11. The apparatus of claim 10, further comprising control circuitry configured to electrically modify the reference voltage potential.

12. The apparatus of claim 10, wherein the sense amplifier includes a delay element configured to delay a triggering of the sense amplifier to read the bit of information from the fuse cell.

13. The apparatus of claim 1, wherein a fuse cell of the fuse array is positioned over a latch configured to latch a bit of data read from the fuse cell.

14. The apparatus of claim 13, wherein the fuse cell and the latch are selected responsive, at least in part, to a common selection signal.

15. A method of blowing a fuse cell of a fuse array, the method comprising:
   providing, with a fuse circuitry disposed between a semiconductor substrate and the fuse array, a program voltage potential to the fuse cell;
   asserting, with the fuse circuitry, a word line signal at a gate terminal of a word line access transistor to electrically connect a bit line to the fuse cell; and
   asserting, with the fuse circuitry, a select voltage potential at a gate terminal of a fuse cell select transistor to electrically connect the bit line to a power supply low voltage potential node.

16. A computing system, comprising:
   a fuse device including:
      a semiconductor substrate;
      a fuse array on or in the semiconductor substrate, the fuse array including a fuse cell; and
      a fuse circuitry configured to access the fuse cell, the fuse circuitry disposed between the semiconductor substrate and the fuse array.

17. The computing system of claim 16, further comprising one or more memory devices including the fuse device.

18. The computing system of claim 17, further comprising:
   one or more processors electrically connected to the one or more memory devices;
   one or more non-volatile data storage devices electrically connected to the one or more processors;
   one or more input devices electrically connected to the one or more processors; and
   one or more output devices electrically connected to the one or more processors.

* * * * *

UNITED STATES PATENT AND TRADEMARK OFFICE
CERTIFICATE OF CORRECTION

PATENT NO. : 11,502,089 B2
APPLICATION NO. : 17/063194
DATED : November 15, 2022
INVENTOR(S) : Yuan He and Daigo Toyama It is certified that error appears in the above-identified patent and that said Letters Patent is hereby corrected as shown below:

In the Specification

Column 9, Line 67, change "time constant T is" to --time constant $\tau$ is--

Signed and Sealed this
Twenty-eighth Day of March, 2023

Katherine Kelly Vidal
*Director of the United States Patent and Trademark Office*